(12) United States Patent
Suenaga et al.

(10) Patent No.: US 12,347,744 B2
(45) Date of Patent: Jul. 1, 2025

(54) BONDED BODY INCLUDING TITANIUM ALLOY AT BONDING BOUNDARY

(71) Applicants: KABUSHIKI KAISHA TOSHIBA, Tokyo (JP); TOSHIBA MATERIALS CO., LTD., Yokohama (JP)

(72) Inventors: Seiichi Suenaga, Yokohama (JP); Maki Yonetsu, Mitaka (JP); Sachiko Fujisawa, Kawasaki (JP)

(73) Assignees: KABUSHIKI KAISHA TOSHIBA, Tokyo (JP); TOSHIBA MATERIALS CO., LTD., Yokohama (JP)

( * ) Notice: Subject to any disclaimer, the term of this patent is extended or adjusted under 35 U.S.C. 154(b) by 104 days.

(21) Appl. No.: 18/146,675

(22) Filed: Dec. 27, 2022

(65) Prior Publication Data

US 2023/0140744 A1   May 4, 2023

Related U.S. Application Data

(63) Continuation of application No. PCT/JP2021/027535, filed on Jul. 26, 2021.

(30) Foreign Application Priority Data

Jul. 27, 2020  (JP) .................................. 2020-126590

(51) Int. Cl.
*H01L 23/15* (2006.01)
*C04B 37/02* (2006.01)
(Continued)

(52) U.S. Cl.
CPC ........ *H01L 23/3735* (2013.01); *C04B 37/025* (2013.01); *H01L 23/15* (2013.01);
(Continued)

(58) Field of Classification Search
CPC ... H01L 23/3735; H01L 23/15; H05K 1/0306; H05K 1/03; H05K 3/38; C04B 37/025; C04B 37/026; B23K 35/302
See application file for complete search history.

(56) References Cited

U.S. PATENT DOCUMENTS 5,100,740 A * 3/1992 Neugebauer .......... C04B 37/021
428/629
6,717,276 B2 * 4/2004 Walter .............. H01L 23/49816
257/779
(Continued)

FOREIGN PATENT DOCUMENTS

CN       106312220 A     1/2017
EP       3 031 789 A1    6/2016
(Continued)

OTHER PUBLICATIONS

International Search Report issued Sep. 28, 2021 in PCT/JP2021/027535 filed on Jul. 26, 2021, 2 pages.
(Continued)

*Primary Examiner* — Ida M Soward
(74) *Attorney, Agent, or Firm* — Oblon, McClelland, Maier & Neustadt, L.L.P.

(57) ABSTRACT

A bonded body includes a ceramic substrate, a copper plate, and a bonding layer provided on at least one surface of the ceramic substrate and bonding the ceramic substrate and the copper plate, in which the bonding layer contains Ag, Cu, Ti, and a first element being one or two selected from Sn and In, a Ti alloy of Ti and at least one selected from Ag, Cu, Sn, and In existing at a bonding boundary between the copper plate and the bonding layer, and the Ti alloy existing over not less than 30% per a length of 30 μm at the bonding boundary.

14 Claims, 4 Drawing Sheets

(51) Int. Cl.
*H01L 23/373* (2006.01)
*H05K 1/03* (2006.01)

(52) U.S. Cl.
CPC ...... *H05K 1/0306* (2013.01); *C04B 2237/366* (2013.01); *C04B 2237/368* (2013.01); *C04B 2237/407* (2013.01)

(56) References Cited

U.S. PATENT DOCUMENTS

| | | | |
|---|---|---|---|
| 8,472,193 B2 * | 6/2013 | Mori | H05K 7/20263 |
| | | | 361/698 |
| 8,637,777 B2 * | 1/2014 | Hayashi | C04B 37/021 |
| | | | 29/830 |
| 11,570,890 B2 * | 1/2023 | Tsugawa | H01L 23/14 |
| 2014/0291699 A1 * | 10/2014 | Yano | H01L 29/1608 |
| | | | 257/77 |
| 2017/0003072 A1 | 1/2017 | Holt et al. | |
| 2017/0044072 A1 | 2/2017 | Terasaki et al. | |
| 2019/0002358 A1 * | 1/2019 | Zeiger | C04B 37/021 |
| 2019/0150298 A1 | 5/2019 | Kishimoto | |
| 2020/0032026 A1 * | 1/2020 | Nakamura | B32B 15/20 |
| 2020/0128664 A1 * | 4/2020 | Harada | H01L 23/3735 |
| 2020/0163210 A1 * | 5/2020 | Yuasa | H05K 1/0306 |
| 2020/0321264 A1 | 10/2020 | Terasaki | |

FOREIGN PATENT DOCUMENTS

| | | | | |
|---|---|---|---|---|
| EP | 3 358 614 A1 | 8/2018 | | |
| EP | 3 460 838 A1 | 3/2019 | | |
| EP | 3 492 441 A1 | 6/2019 | | |
| EP | 4 155 281 A1 | 3/2023 | | |
| JP | 2005-112677 A | 4/2005 | | |
| JP | 2015-209356 A | 11/2015 | | |
| WO | WO-2015019602 A1 * | 2/2015 | ........... | B23K 1/0016 |
| WO | WO-2017115461 A1 * | 7/2017 | ............ | B32B 15/04 |
| WO | WO-2017200004 A1 * | 11/2017 | ............ | B23K 35/22 |
| WO | WO 2017/213207 A1 | 12/2017 | | |
| WO | WO 2018/021472 A1 | 2/2018 | | |
| WO | WO-2018159590 A1 * | 9/2018 | ............ | C04B 37/02 |
| WO | WO 2018/199060 A1 | 11/2018 | | |
| WO | WO-2018221492 A1 * | 12/2018 | ............... | B23K 1/00 |
| WO | WO-2019088222 A1 * | 5/2019 | ............... | B23K 1/00 |

OTHER PUBLICATIONS

Extended European Search Report issued Jul. 18, 2024, in corresponding European Patent Application No. 21851025.3, 9 pages.
Combined Chinese Notice of Allowance and Search Report issued Jan. 6, 2025 in Chinese Patent Application No. 202180059127.9, (with English translation), 8 pages.
Combined Chinese Office Action and Search Report issued Aug. 17, 2024, in corresponding Chinese Patent Application No. 202180059127.9 (with English Translation of Category of Cited Documents), 8 pages.
Long Weimin et al., "Super hard tool fiber welding technology", Oct. 31, 2016, 8 pages (with English machine translation).
Zhu Yan, "Welding", Oct. 31, 2012, 4 pages (with English machine translation).

* cited by examiner

BONDED BODY INCLUDING TITANIUM ALLOY AT BONDING BOUNDARY

CROSS-REFERENCE TO RELATED APPLICATIONS

This is a continuation application of International Patent Application PCT/JP2021/027535, filed on Jul. 26, 2021. This application also claims priority to Japanese Patent Application No. 2020-126590, filed on Jul. 27, 2020. The entire contents of which are incorporated herein by reference.

FIELD

Embodiments described below relate to a bonded body, a circuit board, a semiconductor device, and a method for manufacturing a bonded body.

BACKGROUND

A bonded body of a ceramic substrate and a copper plate is used as a circuit board on which a semiconductor element or the like is mounted. International Publication No. 2018/021472 (Patent Literature 1) discloses a ceramic copper circuit board in which the ceramic substrate and the copper plate are bonded. In Patent Literature 1, a brazing material containing Ag, Cu, Ti, etc. is used for a bonding layer. In Patent Literature 1, thermal bonding is performed under a pressure of not less than $1\times10^{-3}$ Pa during the bonding.

Such a pressure of not less than $1\times10^{-3}$ Pa is called a vacuum. A bonding method using Ti is called an active metal bonding method. Because Ti is an active metal, it is easily nitrided or oxidized. In the active metal bonding method, bonding is performed in a vacuum in order to prevent Ti from nitriding or oxidizing before the bonding. For bonding in a vacuum, an interior of a bonding apparatus must be evacuated. Because the temperature is raised after evacuating, only batch processing can be applied to the thermal bonding process. The thermal bonding process includes four processes of vacuuming, heating, bonding, and cooling per batch. It took more than 24 hours per batch. Thus, it cannot be said that the mass productivity is good.

On the other hand, International Publication No. 2018/199060 (Patent Literature 2) discloses performing a thermal bonding process in a continuous-type furnace. In the example of Patent Literature 2, bonding is performed at a furnace length of 3 m and a conveying speed of 10 cm/min. Thermal bonding was completed in about 2 hours including a holding time during the processes.

DETAILED DESCRIPTION

A bonded body according to an embodiment comprises a ceramic substrate, a copper plate, and a bonding layer provided on at least one surface of the ceramic substrate and bonding the ceramic substrate and the copper plate, in which the bonding layer contains Ag, Cu, Ti, and a first element being one or two selected from Sn and In, a Ti alloy of Ti and at least one selected from Ag, Cu, Sn, and In existing at a bonding boundary between the copper plate and the bonding layer, and the Ti alloy existing over not less than 30% per a length of 30 μm at the bonding boundary.

Figure 1:
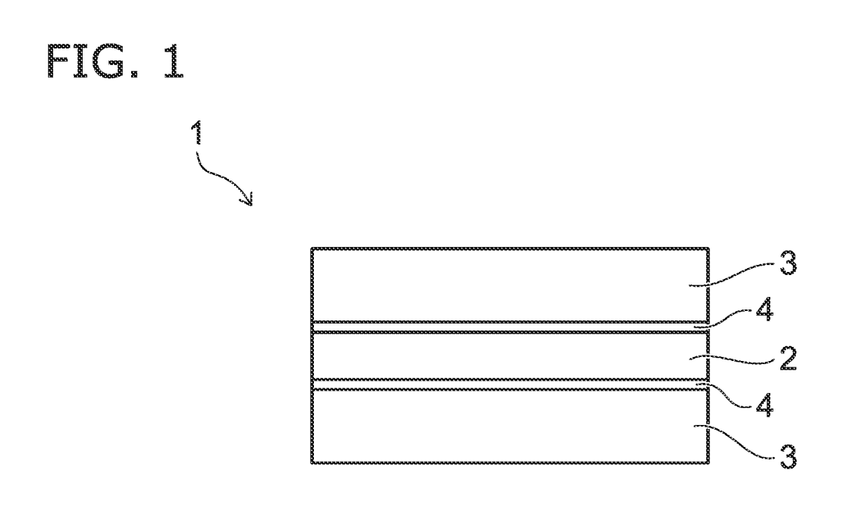
FIG. 1 is a view showing an example of a bonded body according to an embodiment.

FIG. 1 is a schematic view showing an example of a bonded body according to an embodiment. In FIG. 1, 1 is the bonded body, 2 is the ceramic substrate, 3 is the copper plate, and 4 is the bonding layer. FIG. 1 shows the bonded body 1 in which the copper plates 3 are respectively provided on both surface of the ceramic substrate 2 with the bonding layers 4 interposed therebetween. In the example of FIG. 1, the longitudinal and lateral sizes of the ceramic substrate 2 and the copper plate 3 are the same as each other. The bonded body according to the embodiment is not limited to such a form, and may have a structure in which the copper plate 3 is provided only on one surface of the ceramic substrate 2. The longitudinal and lateral sizes of the ceramic substrate 2 and the copper plate 3 may be different from each other.

A silicon nitride substrate, an aluminum nitride substrate, an aluminum oxide substrate, an Alumina zirconia substrate, etc., are examples of the ceramic substrate. It is favorable for the thickness of the ceramic substrate 2 to be not less than 0.1 mm and not more than 1 mm. When the substrate thickness is less than 0.1 mm, there is a possibility that the strength of the ceramic substrate 2 may decrease. Also, when the substrate thickness is greater than 1 mm, there is a possibility that the ceramic substrate may function as a thermal resistor, and the heat dissipation of the bonded body may be degraded.

It is favorable for the three-point bending strength of the silicon nitride substrate to be not less than 600 MPa. Also, it is favorable for the thermal conductivity to be not less than 80 W/m·K. The substrate thickness can be thinned by increasing the strength of the silicon nitride substrate. It is therefore favorable for the three-point bending strength of the silicon nitride substrate to be not less than 600 MPa, and more favorably not less than 700 MPa. Thereby, the substrate thickness of the silicon nitride substrate can be thinned to be not more than 0.40 mm, and even not more than 0.30 mm.

The three-point bending strength of the aluminum nitride substrate is about 300 to 450 MPa. On the other hand, the thermal conductivity of the aluminum nitride substrate is not less than 160 W/m·K. Because the strength of the aluminum nitride substrate is low compared to the silicon nitride substrate, it is favorable for the substrate thickness to be not less than 0.60 mm.

Although the three-point bending strength of the aluminum oxide substrate is about 300 to 450 MPa, the aluminum oxide substrate is inexpensive. Also, although the three-point bending strength of the Alumina zirconia substrate is high, i.e., about 550 MPa, the thermal conductivity of the Alumina zirconia substrate is about 30 to 50 W/m·K.

It is favorable for the ceramic substrate 2 to be one of a silicon nitride substrate or an aluminum nitride substrate. The silicon nitride substrate and the aluminum nitride substrate are nitride ceramic substrates. Nitride ceramics react with an active metal brazing material containing Ti to form titanium nitride. Also, the oxide ceramics react with an active metal brazing material containing Ti to form titanium oxide.

A pure copper plate or a copper alloy plate can be used as the copper plate 3. It is favorable for the copper plate 3 to be oxygen-free copper. As described in JIS-H-3100, the oxygen-free copper has a copper purity of not less than 99.96 wt %.

The bonding layer contains Ag, Cu, Ti, and a first element being one or two selected from Sn and In. Ag (silver), Cu (copper), and Ti (titanium) are essential constituent elements. The bonding layer contains one or two selected from Sn (tin) and In (indium) in addition to these essential constituent elements.

Cu (copper) is an element that serves as a base material of the bonding layer. Even if Cu diffuses into the copper plate, it does not deteriorate the copper plate. Ti (titanium) is an effective element for forming a strong bond by reacting with the ceramic substrate. Ag (silver) is an element that easily alloys with Ti. Sn (tin) or In (indium) is an element effective in lowering the melting point of the bonding brazing material that forms the bonding layer. As will be described later, it is effective to increase the heating rate in order to obtain the desired bonding layer. For that purpose, it is necessary to contain Sn or In.

A Ti alloy of Ti and one or more selected from Ag, Cu, Sn, and In exists at the bonding boundary between the copper plate and the bonding layer. The Ti alloy is characterized by existing over not less than 30% per a length of 30 μm at the bonding boundary.

Figure 2:
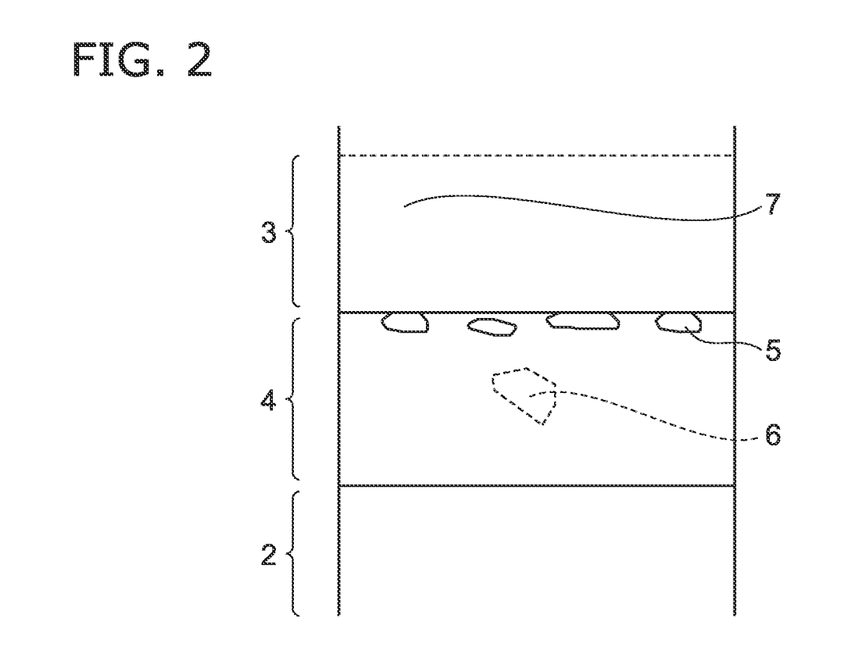
FIG. 2 is a view showing an example of a bonding layer of the bonded body according to the embodiment.

FIG. 2 shows an example of the bonding layer. In FIG. 2, 2 is the ceramic substrate, 3 is the copper plate, 4 is the bonding layer, 5 is the Ti alloy region, 6 is a Ti-poor region, and 7 is a diffusion region.

Scanning Electron Microscope-Energy Dispersive X-ray spectroscopy (SEM-EDX) is used to measure the existence or absence of the Ti alloy at the bonding boundary between the copper plate 3 and the bonding layer 4 and the mass ratio of each element. An example in which the bonding layer and the Ti alloy contain Sn will be described below. A cross section of the bonded body 1 is taken as a measurement area. The cross section of the bonded body 1 is parallel to a direction perpendicular to the surface of the ceramic substrate 2.

As the SEM, JSM-IT100 manufactured by JEOL or an apparatus having equivalent performance is used. As the EDX, EX-9440IT4L11 manufactured by JEOL or an apparatus having equivalent performance is used. First, by EDX, an area analysis of the measurement area of 30 μm×the thickness of the bonding layer is performed. 30 μm of the measurement area is the length in the direction parallel to the surface of the ceramic substrate 2. Regarding the thickness of the bonding layer of the measurement area, The boundary between the copper plate and the bonding layer and the central region of the bonding layer may be included in the measurement area.

The Ti alloy of Ti and one or more selected from Ag, Cu, Sn, and In exists at the bonding boundary between the copper plate and the bonding layer. TiAg alloy, TiCu alloy, TiSn alloy, TiIn alloy, etc., are examples of the Ti alloy. The Ti alloy may contain two or more of Ag, Cu, Sn, or In. The Ti alloy may be a compound or an intermetallic compound containing Ti. The Ti alloy may include a reactant formed by reacting constituent elements with each other or a mixture in which the constituent elements are phase-separated and mixed. That is, the Ti alloy indicates a state in which Ti is mixed with one or more selected from Ag, Cu, Sn and In.

The Ti alloy exists over not less than 30% per a length of 30 μm at the bonding boundary. The existence of not less than 30% per the length of 30 μm at the bonding boundary indicates that the Ti alloy exists over not less than 9 μm per 30 μm. It is not necessary for one aggregate of Ti alloy to exist over not less than 30% of the length of 30 μm at the bonding boundary, and multiple dispersed Ti alloys may exist. It is sufficient that the total amount of the Ti alloy exists over not less than 30% per the length of 30 μm at the bonding boundary.

The existence of the Ti alloy at the bonding boundary can suppress the diffusion of Ag, Sn, and In into the copper plate. When Ag diffuses into the copper plate, Ag may precipitate on the surface of the copper plate. In the case where there is Ag on the surface of the copper plate, when mounting the semiconductor element thereon, the wettability of the solder is lowered. Also, when Sn or In diffuses into the copper plate, the melting point of the copper plate is lowered. In the case where the melting point of the copper plate is lowered, the copper plate may be distorted during bonding or TCT testing. The existence of the Ti alloy at the bonding boundary can suppress the diffusion of elements that adversely affect the copper plate.

The mass ratio of Ag is preferably not more than 20 mass % when surface analysis is performed for a cross section of the bonding layer. Further, when surface analysis is performed for a cross section of the bonding layer, the ratio $M_{Ag}/M_{Cu}$ of the mass $M_{Ag}$ of Ag to the mass $M_{Cu}$ of Cu is preferably not more than ⅙. TiAg alloy is easily formed by setting the amount of Ag in the surface analysis to not more than 20 mass %. Therefore, the amount of Ag is preferably not less than 1 mass % and not more than 20 mass %. The mass ratio $M_{Ag}/M_{Cu}$ being not more than ⅙ in the surface analysis indicates that the amount of Cu is at least 6 times the amount of Ag in the bonding layer. The Ti alloy is easily formed by decreasing the amount of Ag and increasing the amount of Cu.

In addition, when surface analysis is performed for a cross section of the bonding layer, the ratio $M_{Ag}/(M_{Ag}+M_{Ti})$ of the mass $M_{Ag}$ of Ag to the sum of the mass $M_{Ag}$ of Ag and the mass $M_{Ti}$ of Ti is preferably not more than 0.65. The surface analysis is performed for an arbitrary cross section of the bonding layer 4 using EDX. The measurement magnification of SEM-EDX is set to 1000 times. The thickness direction of the measurement area is set so as to include the bonding layer 4 between the ceramic substrate 2 and the copper plate 3. The width of the measurement area in the surface analysis is set to 30 μm. The width is a dimension in the direction parallel to the surface of the ceramic substrate 2. The length in the thickness direction of the measurement area in the surface analysis is set to the thickness of the bonding layer 4.

The bonding boundary between the ceramic substrate 2 and the bonding layer 4 is the bonding boundary between the ceramic substrate 2 and the Ti-aggregate layer. When the ceramic substrate 2 is a nitride-based ceramic substrate, the Ti-aggregate layer contains titanium nitride (TiN). The atomic ratio of titanium to nitrogen in the titanium nitride contained in the Ti-aggregate layer may be other than 1:1.

The bonding boundary between the bonding layer 4 and the copper plate 3 is the farthest point (the farthest point from the ceramics substrate 2) where the components of the bonding layer are connected and contact the copper plate 3 within the measurement area. Because the bonding layer 4 contains Ti, Ag, Sn or In, the bonding boundary between the bonding layer 4 and the copper plate 3 is determined based on the diffusion state of these elements. When the ceramic substrate 2 is an oxide-based ceramic substrate, the Ti-aggregate layer contains titanium oxide. Titanium oxide as the Ti-aggregate layer may contain compounds having various atomic ratios such as $TiO_2$, TiO, and $Ti_2O_3$.

Three arbitrary measurement areas that do not overlap each other are measured using EDX, and the average value of the mass of each element is obtained. Thereby, the mass ratio of Ag and Ti in the bonding layer 4 can be grasped. The mass ratio $M_{Ag}/(M_{Ag}+M_{Ti})$ being not more than 0.65 indicates that the amount of Ag in the bonding layer is small. Thereby, the barrier effect of Ti for Ag can be enhanced.

At least a portion of the Ti alloy is an alloy containing Ti and Ag. The Ti alloy preferably includes a Ti-rich region containing Ti and Ag. In the Ti-rich region, the ratio $M_{Ti}/M_{Ag}$ of the mass $M_{Ti}$ of Ti to the mass $M_{Ag}$ of Ag is not less than 0.6. In the Ti alloy 5, a region where $M_{Ti}/M_{Ag}$ is not less than 0.6 is taken as the Ti-rich region. The Ti-rich region may be a portion of the Ti alloy 5 or may be the entire Ti alloy 5. The Ti alloy 5 is hereinafter also referred to as the Ti-rich region 5. Ag is an element that easily diffuses into a copper plate. On the other hand, Ag is an element that easily alloys with Ti. By providing the alloy containing Ti and Ag with the mass ratio $M_{Ti}/M_{Ag}$ of not less than 0.6, diffusion of Ag into the copper plate can be suppressed. When the mass ratio $M_{Ti}/M_{Ag}$ is not more than 0.5, there is a possibility that the effect of diffusing Ag into the copper plate will be reduced due to the large amount of Ag. Hereinafter, an alloy containing Ti and Ag may be called a TiAg alloy. In a result of the surface analysis described above, it can be determined that the TiAg alloy is formed in the region in which the area where Ti exists and the area where Ag exists overlap. With respect to Sn, In, Cu, and C, which will be described later, it can be determined that these elements exist in the Ti alloy when the areas where these elements exist overlap with the area where Ti exists in the result of the surface analysis.

Point analysis by SEM-EDX is used to measure the mass ratio of the elements in the Ti alloy. The measuring apparatus is as described above. The measurement magnification of the point analysis is set to 1000 times. Point analysis is a measurement method in which the beam spot diameter of X-ray is narrowed. It is effective for measuring mass ratios in a narrow range. By the surface analysis described above, a region where the mass ratio $M_{Ti}/M_{Ag}$ is not less than 0.6 and a region where the mass ratio $M_{Ti}/M_{Ag}$ is not more than 0.5 are grasped. 5 arbitrary points in the region to be measured are measured by the point analysis, and the average value of the mass of each element is taken as the composition of the Ti alloy. For example, when measuring the composition of the Ti-rich region where the mass ratio $M_{Ti}/M_{Ag}$ is not less than 0.6, arbitrary 5 points in the Ti-rich region are measured using the point analysis.

The Ti-rich region can suppress diffusion of Sn or In into the copper plate. That is, the Ti-rich region functions as a barrier layer that suppresses diffusion of Ag, Sn, or In into the copper plate. The Ti-rich region is preferably at least a portion of the Ti alloy existing at the bonding boundary. More preferably, the area ratio of the Ti alloy is not less than 50% and not more than 100%.

At least a portion of the Ti alloy is an alloy containing Ti and the first element. A Ti-rich region in which the ratio $M_{Ti}/M_{E1}$ of the mass $M_{Ti}$ of Ti to the mass $M_{E1}$ of the first element is not less than 0.4 preferably exists in the alloy containing Ti and the first element. The Ti alloy at the bonding boundary functions as the barrier layer. When there is the Ti-rich region in which the mass ratio $M_{Ti}/M_{E1}$ is not less than 0.4, Ti can suppress the diffusion of Sn or In into the copper plate. Hereinafter, an alloy containing Ti and Sn may be called a TiSn alloy. An alloy containing Ti and In may be called a TiIn alloy. The TiSn alloy or TiIn alloy may contain Ag. That is, a TiAgSn alloy or a TiAgIn alloy may exist. Thus, a TiAg alloy may exist in the same region in which the TiSn alloy or TiIn alloy exists. The existence of the Ti alloy containing a large amount of Ti in terms of mass ratio improves the function as the barrier layer.

Figure 3:
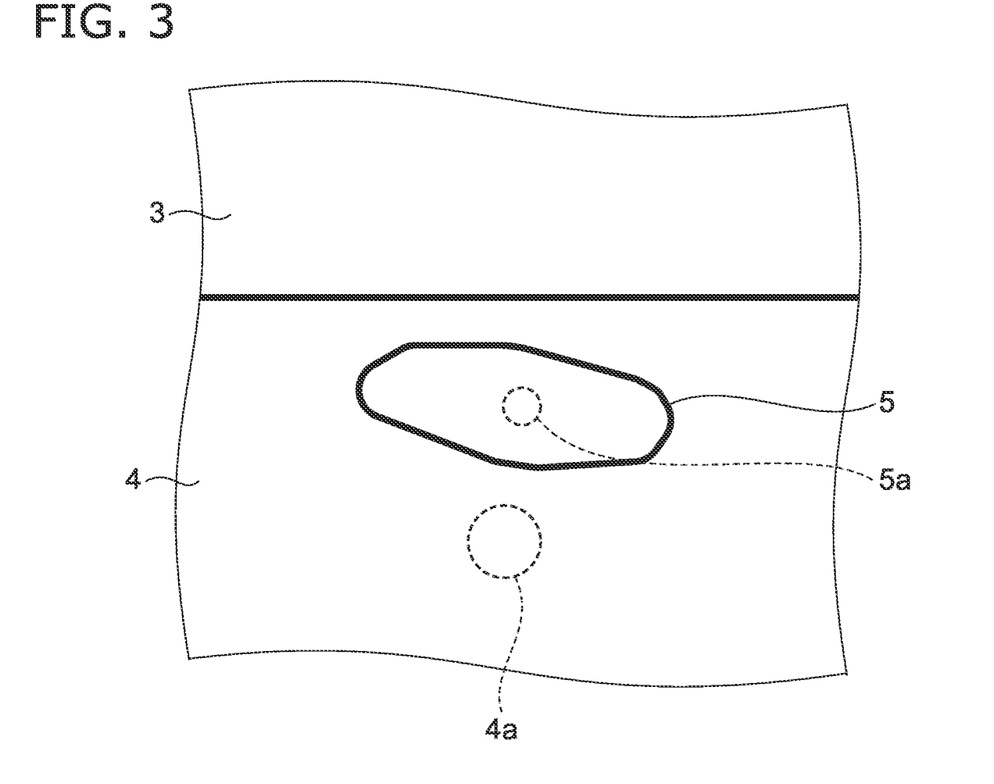
FIG. 3 is an enlarged view showing the bonding layer of the bonded body according to the embodiment.

FIG. 3 is a partially enlarged view of the bonding layer of the bonded body according to the embodiment. FIG. 3 shows a state in which 100% of the Ti alloy is the Ti-rich region. As shown in FIG. 3, the bonding layer 4 includes a region 4a positioned between the ceramic substrate 2 and the Ti-rich region 5. When the amount of Cu in the central portion 5a of the Ti-rich region and the amount of Cu in the region 4a of the bonding layer 4 are compared, the amount of Cu in the central portion 5a is preferably smaller. The fact that the amount of Cu in the central portion 5a is small indicates that elements other than Cu are concentrated in the Ti-rich region 5. In other words, it indicates that the Ti-rich region 5 functions as the barrier layer.

It is preferable that a region having a Cu content of not less than 70% by mass ratio exists on the ceramic substrate side with respect to the Ti-rich region. The region on the ceramic substrate side with respect to the Ti-rich region is a region located on the ceramic substrate side by about 1 to 3 μm from the Ti-rich region, such as the region 4a shown in FIG. 3. It is preferable that there is a region containing not less than 90 mass % of Cu between the Ti-rich region and the copper plate. The existence of the region containing not less than 90 mass % of Cu between the Ti-rich region and the copper plate indicates that the Ti-rich region 5 exists at the bonding boundary between the copper plate 3 and the bonding layer 4. In confirming the mass ratio, the amount of Cu in a region located on the copper plate side by about 1 to 3 μm from the Ti-rich region 5 is measured. The Ti-rich region 5 exists at the bonding boundary between the copper plate 3 and the bonding layer 4. It is preferable that there is a region containing less than 90 mass % of Cu on the ceramic substrate 2 side in the Ti-rich region 5. Moreover, it is preferable that there is a region containing not less than 90% of Cu in mass ratio between the copper plate 3 and the Ti-rich region 5. This indicates that there is a difference in the mass ratios of Cu between the two regions sandwiching the Ti-rich region 5. Because the Ti-rich region 5 has a barrier effect to Ag, Sn, and In, the difference occurs in the mass ratios of Cu. As the Ti-rich region 5 has higher function as the barrier layer, the difference in the mass ratios of Cu between the two regions sandwiching the Ti-rich region 5 increases. The surface analysis described above is used to measure the mass ratios of Cu in these regions.

The Ti-rich region preferably contains carbon. By adding carbon to the bonding brazing material, the fluidity and wettability of the bonding brazing material can be controlled. The fact that the Ti-rich region 5 contains carbon indicates that the Ti-rich region 5 also functions as a barrier layer that traps carbon.

For the measurement of the amount of Cu in the central portion 5a of the Ti-rich region 5 and the amount of Cu in the region 4a of the bonding layer 4, the point analysis of SEM-EDX is used. As for the central portion of the Ti-rich region, the point analysis is performed at the vicinity of the center of the Ti-rich region. As for the region of the bonding layer, the point analysis is performed at the region located on the ceramic substrate side by about 1 to 3 μm from the Ti-rich region. The point analysis may be respectively performed at arbitrary one point. For the measurement of the amount of Cu between the copper plate and the Ti-rich region, the point analysis is performed at the region located on the copper plate side by about 1 to 3 μm from the Ti-rich region.

A Ti-poor region preferably exists in the central portion of the bonding layer. In the Ti-poor region, the ratio $M_{Ti}/M_{Ag}$ of the mass $M_{Ti}$ of Ti to the mass $M_{Ag}$ of Ag is not more than 0.1. The central portion of the bonding layer is the center of the bonding layer 4 in the thickness direction. A region located in the middle between the boundary of the ceramic substrate 2 and the bonding layer 4 and the boundary of the bonding layer 4 and the copper plate 3 is called the central portion. The Ti content in the Ti-rich region is greater than the Ti content in the Ti-poor region.

The mass ratio $M_{Ti}/M_{Ag}$ in the central portion of the bonding layer being not more than 0.1 indicates that the amount of Ti is significantly smaller than the amount of Ag. The active metal bonding layer includes the Ti-aggregate layer formed on the surface of the ceramic substrate 2. The Ti-aggregate layer of the nitride-based ceramic substrate 2 contains titanium nitride (TiN). Also, the Ti-aggregate layer of the oxide-based ceramic substrate 2 contains titanium oxide. Bonding strength can be improved by forming the Ti-aggregate layer on the surface of the ceramic substrate 2.

The fact that the amount of Ti existing in the central portion of the bonding layer is small indicates that Ti in the bonding layer exists as the Ti-aggregated layer and the Ti alloy at the bonding boundary between the copper plate 3 and the bonding layer 4. In other words, it indicates that Ti in the bonding layer has both functions of improving the bonding strength and suppressing the diffusion of Ag or the like to the copper plate.

Note that the bonding layer may include a region in which the mass ratio $M_{Ti}/M_{Ag}$ exceeds 0.1. If it is not connected to the Ti-aggregate layer on the surface of the ceramic substrate 2 and not connected to the Ti-rich region at the boundary of the bonding layer with the copper plate 3, the region where the mass ratio $M_{Ti}/M_{Ag}$ exceeds 0.1 may exist in the bonding layer. It is effective that the Ti-aggregate layer and the Ti-rich region are separated from each other by the region where the mass ratio $M_{Ti}/M_{Ag}$ is not more than 0.1.

In the Ti-poor region, the ratio $M_{Ag}/M_{Cu}$ of the mass $M_{Ag}$ of Ag to the mass $M_{Cu}$ of Cu is preferably not more than 0.1. The mass ratio $M_{Ag}/M_{Cu}$ in the Ti-poor region in the central portion of the bonding layer being not more than 0.1 indicates that the amount of Ag in the bonding layer is small. When the amount of Ag is large, the mass ratio $M_{Ti}/M_{Ag}$ in the Ti alloy at the bonding boundary between the copper plate 3 and the bonding layer 4 tends to be not more than 0.5. Moreover, it is preferable that the Ti-poor region exists in not less than 50% of the central portion of the bonding layer. Regarding the composition analysis of the Ti-poor region, an arbitrary area analysis of 50 μm×3 μm is measured on a horizontal line passing through the center of the bonding layer 4 and the average value is calculated. When the analysis cannot be performed in one field of view, the average value may be obtained using a plurality of area analysis results.

when an amount of Ag in the Ti-rich region is taken as A (wt %) and an amount of Ag at the point entered 30 μm into the copper plate from the bonding boundary is taken as B (wt %), it is preferable that A>B.

As shown in FIG. 2, a region from the bonding boundary between the copper plate 3 and the bonding layer 4 to the point entered 30 μm into the copper plate 3 is taken as the diffusion region 7. The bonding boundary between the copper plate 3 and the bonding layer 4 can be determined from the position where the Ti alloy 5 having the Ti-rich region exists.

The fact that is A>B indicates that the amount of Ag diffused into the copper plate is small, as compared with the Ti-rich region at the bonding boundary between the copper plate 3 and the bonding layer 4. Ag is an element easily diffused into the copper plate. Even in the narrow diffusion region 7 of 30 μm, A>B is satisfied, and it indicates that the Ti-rich region functions as the barrier layer.

When an amount of Sn in the Ti-rich region is taken as D (wt %), and an amount of Sn at the point entered 30 μm into the copper plate from the bonding boundary is taken as E (wt %), it is preferably D>E. This indicates that the diffusion of Sn into the copper plate can be suppressed. The same applies when Sn is replaced with In.

The thickness of the copper plate is preferably not less than 0.3 mm. The Ti-rich region at the bonding boundary of the copper plate 3 and the bonding layer 4 can suppress the diffusion of Ag, Sn or In to the copper plate. The thicker the copper plate, the more susceptible it is to the spread of Ag, Sn or In. Because it is possible to suppress the diffusion, even if the copper plate is thick, i.e., not less than 0.3 mm, further not less than 0.6 mm, the occurrence of defects can be suppressed.

The bonded body as described above is suitable for a circuit board. Also, a semiconductor element can be mounted on the circuit board according to the embodiment, and the circuit board can be used for a semiconductor device.

Figure 4:
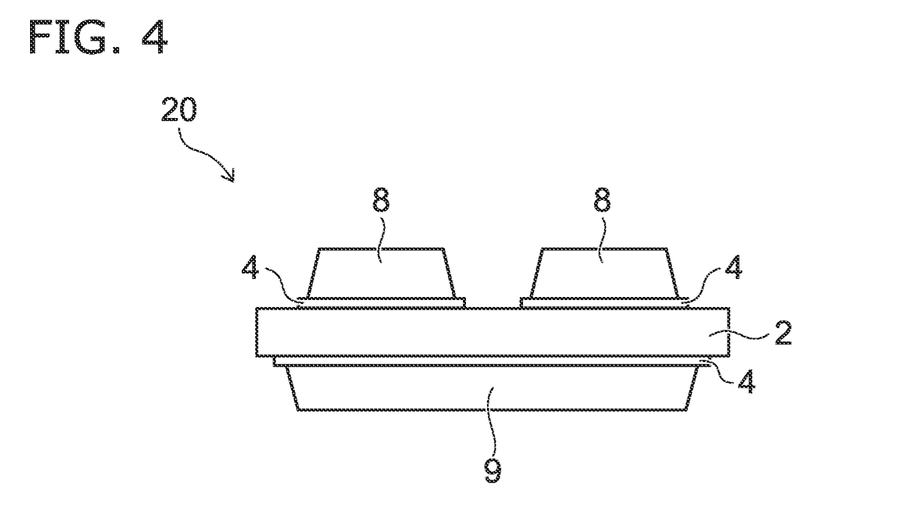
FIG. 4 is a view showing an example of a circuit board according to the embodiment.
Figure 5:
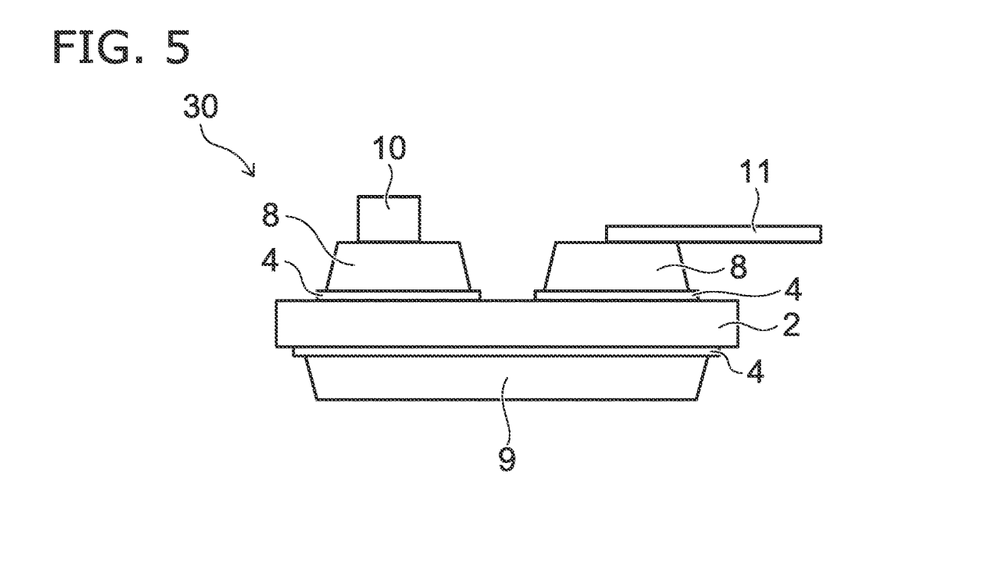
FIG. 5 is a view showing an example of a semiconductor device according to the embodiment.

FIG. 4 is a schematic view showing an example of the circuit board according to the embodiment. FIG. 5 is a schematic view showing an example of the semiconductor device according to the embodiment. In FIG. 4 and FIG. 5, 8 is a copper circuit portion, 9 is a heat dissipation plate, 10 is a semiconductor element, 11 is a lead frame, 20 is a circuit board, and 30 is a semiconductor device.

In the circuit board 20 shown in FIG. 4, the copper plate 3 on the front side of the bonded body 1 is processed into the copper circuit portion 8, and the copper plate 3 on the back side is processed into the heat dissipation plate 9. The circuit board 20 is made by providing the circuit configuration to the copper plate 3 of the bonded body 1. In the semiconductor device 30 shown in FIG. 5, the semiconductor element 10 is mounted on the copper circuit portion 8 of the circuit board 20. In addition to the semiconductor element 10, the lead frame 11 or the like may be mounted as necessary in the semiconductor device 30. In the example shown in FIG. 4, the circuit board 20 has a structure in which two copper circuit portions 8 are provided, but the structure of the circuit board 20 is not limited to this example. The number or the sizes of the copper circuit portions 8 can be changed as required. The respective numbers of semiconductor elements 10 and lead frames 11 can also be changed arbitrarily. Also, the copper plate 3 on the back side is used as the heat dissipation plate 9 in FIG. 4, but the copper plates 3 on both sides may be provided with circuit configurations.

If necessary, the side surface of the copper circuit portion 8 and the side surface of the heat dissipation plate 9 may be inclined. If necessary, the bonding layer 4. may be provided with a jutting portion that juts from the side edge of the copper circuit portion 8 or the side edge of the heat dissipation plate 9. It is preferable to use an etching process to provide the circuit configuration and to provide the inclined shape of the side surface of the copper plate.

Next, a method for manufacturing a bonded body according to the embodiment will be described. The manufacturing method is not limited, as long as the bonded body according to the embodiment has the above structure. Here, an example of a method for obtaining the bonded body according to the embodiment with a high yield will be described.

First, the ceramic substrate 2 is prepared. A silicon nitride substrate, an aluminum nitride substrate, an aluminum oxide substrate, an Alumina zirconia substrate, etc., are examples of the ceramic substrate 2. The Alumina zirconia substrate is a substrate in which aluminum oxide and zirconium oxide are mixed.

The oxygen-free copper plate or the copper alloy plate can be used for the copper plate 3. The copper plate is preferably the oxygen-free copper. The oxygen-free copper is a copper plate having a copper purity of not less than 99.96 wt %, as specified in JIS-H-3100 (ISO1337, etc.).

Next, the bonding brazing material is prepared. The bonding brazing material preferably contains not less than 50 mass % of Cu, not less than 4 mass % and not more than 30 mass % of Ti, not less than 5 mass % and not more than 40 mass % of one or two selected from Sn and In, not less than 1 mass % and not more than 20 mass % of Ag, not less than 0 mass % and not more than 2 mass % of Carbon. The conventional active metal brazing material contains not less than 40 mass % of Ag. By setting the amount of Ag to not less than 1 mass % and not more than 20 mass %, it becomes easier to form the Ti-rich region in which the mass ratio $M_{Ti}/M_{Ag}$ is not less than 0.6.

Also, the bonding brazing material is prepared so that it can be bonded even if a rapid heating process with a heating rate of not less than 20° C./min is performed.

It is preferable that the bonding brazing material has an endothermic peak in the range of not less than 520° C. and not more than 590° C. in the DSC curve of the heating process at the heating rate of 20° C./min.

The DSC curve is obtained by applying heat to a sample and measuring the existence or absence of endothermic reaction and exothermic reaction using a Differential Scanning Calorimeter (DSC). When the endothermic reaction or the exothermic reaction occurs, a peak appears in the DSC curve. A peak in the negative direction is the endothermic reaction, and a peak in the positive direction is the exothermic reaction. The endothermic reaction indicates that the sample is melting, decomposing, etc. The exothermic reaction indicates that the constituent elements of the sample react with each other to form or solidify a compound (including alloying). Larger peak indicates larger heat of the reaction. Here, the peak in the negative direction is called an endothermic peak, and the peak in the positive direction is called an exothermic peak. Also, the apex of the peak is called a peak top. The difference between the local maximum point and the local minimum point of the peak is called a peak height.

For example, the endothermic peak is in the negative direction, so it goes up, then down, then up. The endothermic peak includes a change of a local maximum point→a local minimum point→a local maximum point. The local minimum point (the lowest point) is the peak top. Of the local maximum points on the low-temperature and high-temperature sides of the local minimum point, the larger value (larger peak in the positive direction) is taken as the top maximal point. The peak height is the value obtained by subtracting the local minimum point from the top maximal point.

For example, the exothermic peak is in the positive direction, so it goes down, then up, then down. The exothermic peak includes a change of a local minimum point→a local maximum point→a local minimum point. The local maximum point (the highest point) is the peak top. Of the local minimum points on the low-temperature and high-temperature sides of the local maximum point, the smaller value (larger peak in the negative direction) is taken as a bottom minimal point. The peak height is the value obtained by subtracting the bottom minimal point from the local maximum point.

The end point of the endothermic peak (peak in the negative direction) may appear as the exothermic peak (peak in the positive direction), but it is counted as the exothermic peak here. Each peak may be obtained by drawing a baseline.

As the DSC, TGA-DSC simultaneous thermal analysis device STA449-F3-Jupiter manufactured by NETZSCH or a device having equivalent performance is used. Also, the measurement is carried out in an Ar (argon) flow by dropping an appropriate amount of brazing material into an alumina container. The measurement is carried out with the lid of the alumina container closed. It is necessary to prevent the brazing material from reacting with the atmosphere by measuring in the Ar atmosphere. In addition, the amount (mg) dropped is measured with a balance. Not less than 15 mg of the solid content of the sample is prepared.

A temperature profile for obtaining the DSC curve consists of the heating process described above, a holding process, and a cooling process. The heating process is a process of raising the temperature from room temperature to 950° C. at the heating rate of 20° C./min. The holding process is a process of holding at 950° C. for 20 minutes. The cooling process is a process of lowering the temperature from 950° C. to room temperature at a cooling rate of 20° C./min. The holding process is performed after the heating process, and the cooling process is performed after the holding process. Hereinafter, the DSC curve of the heating process with the heating rate of 20° C./min may be referred to as the DSC curve of the heating process. The DSC curve of the cooling process with the cooling rate of 20° C./min may be referred to as the DSC curve of the cooling process. In the DSC curve, a difference in heat flow of not less than 0.02 mW/mg between the baseline and the apex of a protrusion was counted as a peak.

Figure 6:
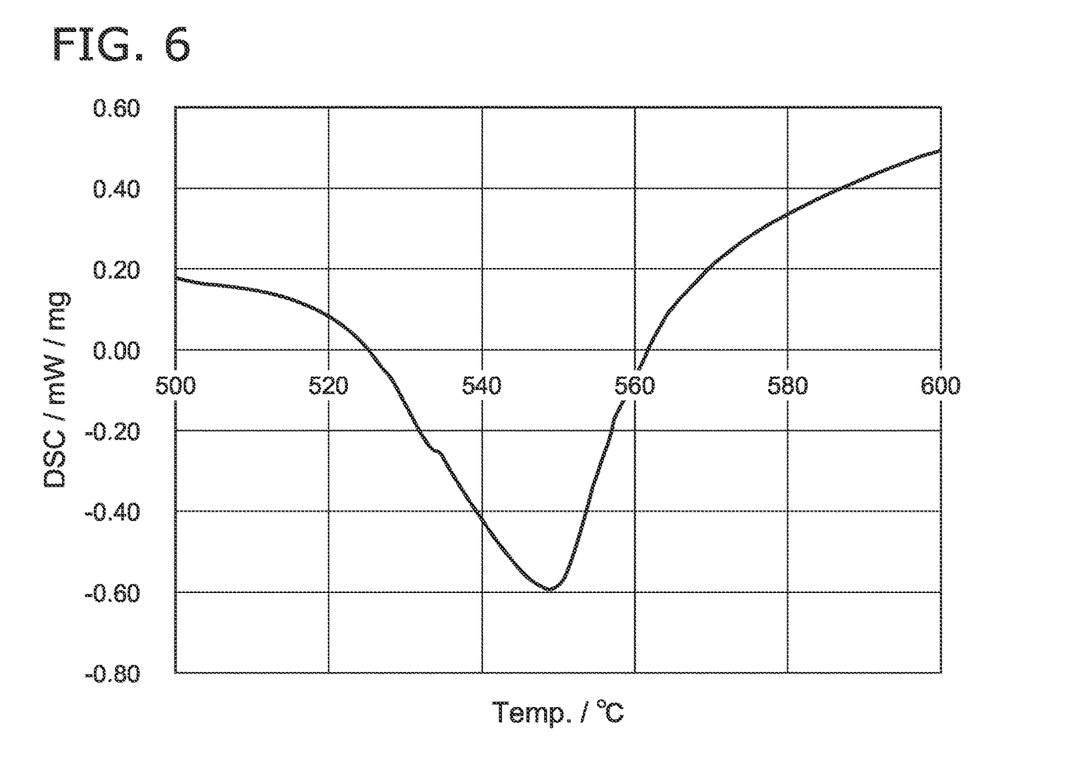
FIG. 6 is a DSC curve (500 to 600° C.) of a heating process of a bonding brazing material used in an example 1.
Figure 7:
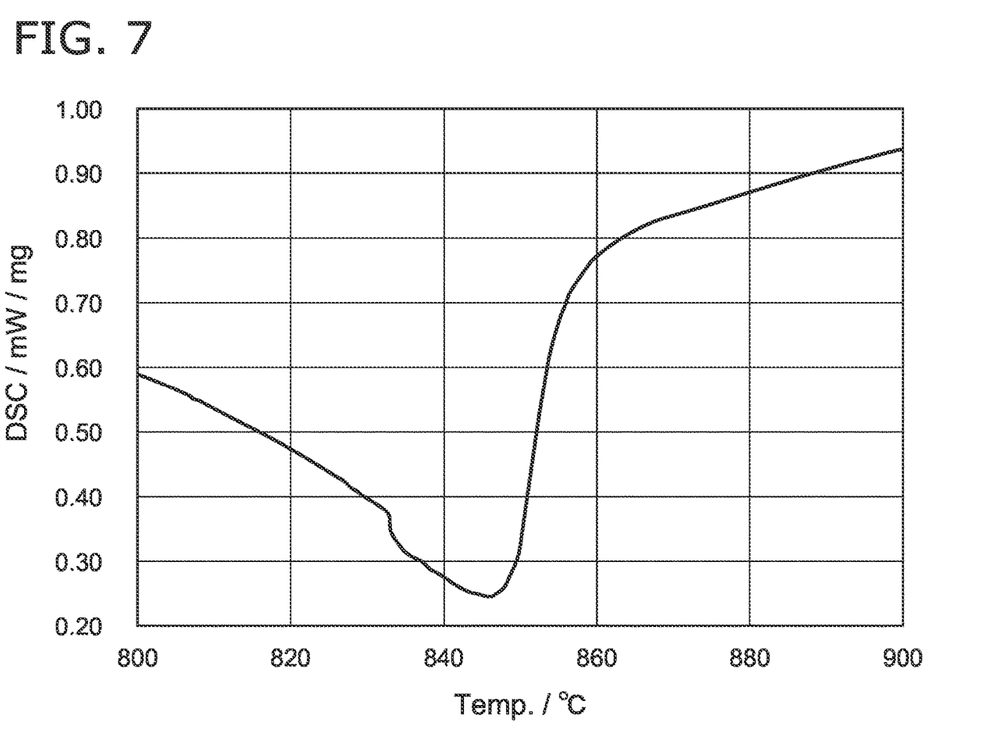
FIG. 7 is a DSC curve (800 to 900° C.) of the heating process of the bonding brazing material used in the example 1.

FIG. 6 shows the DSC curve (500 to 600° C.) of the heating process of the bonding brazing material used in an example 1. FIG. 7 shows the DSC curve (800 to 900° C.) of the heating process of the bonding brazing material used in the example 1. In FIG. 6 and FIG. 7, the horizontal axis represents temperature (° C.) and the vertical axis represents heat flow (mW/mg). In FIG. 6 and FIG. 7, the heat flow is denoted as DSC.

It is preferable that the DSC curve of the heating process at the heating rate of 20° C./min has an endothermic peak in the range of not less than 520° C. and not more than 590° C. Moreover, it is preferable to have an endothermic peak within the range of not less than 810° C. to 890° C. of the heating process. The endothermic peak within the range of not less than 520° C. and not more than 590° C. in the DSC curve of the heating process is called a first endothermic peak. When there are two or more endothermic peaks in the range of not less than 520° C. and not more than 590° C. in the DSC curve of the heating process, the largest peak is taken as the first endothermic peak. The largest peak indicates a large peak on the minus side. Also, the endothermic peak within the range of not less than 810° C. to 890° C. in the DSC curve of the heating process is called a second endothermic peak. When there are two or more endothermic peaks within the range of not less than 810° C. to 890° C. in the DSC curve of the heating process, the largest peak is taken as the second endothermic peak. The largest peak indicates a large peak on the minus side. FIG. 6 is a chart showing an example of the first endothermic peak. FIG. 7 is a chart showing an example of the second endothermic peak.

The first endothermic peak indicates that the decomposition reaction of $TiH_2$ occurs. The decomposed hydrogen has the effect of removing impurity oxygen in the brazing material and activating metal components. AgCuSnTi brazing material containing not less than 40 mass % of Ag is used as a conventional active metal brazing material. In the conventional active metal brazing material, the decomposition reaction of $TiH_2$ occurs at 480-500° C. In other words, there is no first endothermic peak in the DSC curve of the conventional active metal brazing material. By shifting the decomposition reaction of $TiH_2$ to the high-temperature side, the nitriding of the bonding brazing material can be suppressed. When the nitride-based ceramic substrate and the copper plate are bonded using the active metal brazing material, the Ti-aggregate layer is formed on the surface of the ceramic substrate. By shifting the decomposition reaction of $TiH_2$ to the high-temperature side, it is possible to suppress nitriding of Ti in the brazing material before it reacts with the ceramic substrate. Therefore, bonding can be performed in the nitrogen atmosphere.

The second endothermic peak indicates the melting reaction between Cu and the first element. This melting reaction may include the melting reaction of Ag and copper. Cu and the first element are elements that form the base material of the bonding brazing material. Therefore, the second endothermic peak indicates that the reaction occurs in which the bonding brazing material melts and a liquid phase is generated. For conventional active metal brazing material, the decomposition reaction of $TiH_2$ occurs at 480-500° C. That is, there is no first endothermic peak in the conventional active metal brazing material. The temperature difference between the peak indicating the decomposition reaction of $TiH_2$ and the second endothermic peak indicating the melting reaction between Cu and the first element can be reduced by using the bonding brazing material in which the first endothermic peak occurs. As a result, the bondability can be maintained even if the heating rate in the bonding process is increased.

It is preferable that the DSC curve of the cooling process at the cooling rate of 20° C./min has an exothermic peak. The exothermic peak in the cooling process indicates that the formation or solidification of a compound (an alloy) in the bonding layer occurs. The thermal stress is greatest when the molten brazing material solidifies. This is because members having different coefficients of thermal expansion are constrained after the bonding boundary is formed, and the stress is generated during cooling due to the difference in the thermal expansions. Therefore, it is preferable that the DSC curve in the cooling process has the exothermic peak at not more than 890° C. The DSC curve may have two or more exothermic peaks. Having two or more exothermic peaks indicates that the formation or the solidification of the compound (alloy) in the bonding layer is performed in multiple steps. This improves the stress relaxation effect of the bonded body.

Moreover, it is preferable that the DSC curve of the cooling process at the cooling rate of 20° C./min has an exothermic peak at not less than 450° C. and not more than 550° C. The exothermic peak at not less than 450° C. and not more than 550° C. in the DSC curve of the cooling process at the cooling rate of 20° C./min is called a first exothermic peak. When there are two or more exothermic peaks in the temperature range, the largest peak is taken as the first exothermic peak. When the exothermic peak in the cooling process is less than 450° C., the solidification temperature is too low, and there is a possibility that the reliability of the bonding will decrease. On the other hand, when the exothermic peak is high, i.e., greater than 550° C., the thermal stress may increase.

Also, when comparing the peak top temperatures of the first endothermic peak of the heating process and the first exothermic peak of the cooling process, the peak top temperature of the first exothermic peak is preferably lower. The first endothermic peak is mainly caused by the decomposition reaction of $TiH_2$. On the other hand, the first exothermic peak in the cooling process is an exothermic reaction caused by solidification of the bonding layer or formation of Ti compounds. By setting the position of the peak top of the first exothermic peak in the cooling process to a temperature lower than the position of the peak top of the first endothermic peak in the heating process, it is possible to suppress the generation of thermal stress in the cooling process. As long as the cooling process has the exothermic peak, the first exothermic peak may not be present. Also, a similar effect can be obtained by having two or more exothermic peaks in the DSC curve of the cooling process.

Such bonding brazing material can be bonded at the heating rate of not less than 20° C./min or at the cooling rate of not less than 20° C./min. Also, the bonding atmosphere may be in a vacuum or in a nitrogen atmosphere. Note that the vacuum means an atmosphere of not more than $1\times10^{-3}$ Pa. Also, the nitrogen atmosphere means an atmosphere containing not less than 70 vol % of nitrogen. Argon gas or air atmosphere is an example of a component other than nitrogen.

Controlling the composition of the brazing material is effective in controlling the DSC curve. The bonding brazing material preferably contains not less than 50 mass % of Cu, not less than 4 mass % and not more than 30 mass % of Ti, not less than 5 mass % and not more than 40 mass % of one or two selected from Sn and In, not less than 0 mass % and not more than 20 mass % of Ag, not less than 1 mass % and not more than 2 mass % of Carbon. It is preferable that Carbon is not less than 0.1 mass % and not more than 1 mass %.

The total content of Cu, Ti, and the first element is preferably not less than 80 mass %, more preferably not less than 90 mass % and not more than 99 mass %. Also, the total content of Cu and the first element is preferably not less than 70 mass %. The melting point of the brazing material can be raised by lowering the content proportion of Ag. This makes it possible to obtain the brazing material having the desired DSC curve even if the heating rate and cooling rate are increased.

About Cu powder used as the raw material of the brazing material, the average grain size $D_{50}$ is preferably not more than 12.0 μm, more preferably not more than 10.0 μm. The average grain size $D_{50}$ of $TiH_2$ powder is preferably not more than 6.0 μm, more preferably not more than 4.0 μm. The average grain size $D_{50}$ of Sn powder or In powder is preferably not more than 16.0 μm, more preferably not more than 14.0 μm. The average grain size $D_{50}$ of C powder is preferably not more than 6.0 μm, more preferably not more than 4.0 μm. The average grain size $D_{50}$ of Ag powder is preferably not more than 3.0 μm, more preferably not more than 2.0 μm. By controlling the grain size of the powder, the reaction of each powder can be made uniform.

The average grain size $D_{50}$ of the Cu powder is preferably smaller than the average grain size $D_{50}$ of the Sn powder or In powder. As described above, Cu and the first element are the base materials for the brazing material composition. Sn and In are elements having lower melting points compared with Cu. By increasing the grain size of Sn or In, the reaction between Sn powder and Cu powder or the reaction between In powder and Cu powder can be homogenized. As a result, it can be bonded even if the heating rate or the cooling rate is increased.

A process of bonding the ceramic substrate and the copper plate is performed using the brazing material as described above. A brazing material paste is prepared by mixing a bonding brazing material with an organic substance. The brazing material paste is applied to the surface of the ceramic substrate 2 (or the copper plate 3) to form a brazing material paste layer. The copper plate 3 (or the ceramic substrate 2) is placed on the brazing material paste layer.

The thermal bonding process is performed in vacuum or in the nitrogen atmosphere. In vacuum means under pressure of not more than $1\times10^{-3}$ Pa. The nitrogen atmosphere is an atmosphere containing not less than 70 vol % of nitrogen. The nitrogen atmosphere preferably has a nitrogen content of not less than 70 vol %, more preferably not less than 85 vol % and not more than 100 vol %. The nitrogen atmosphere may contain argon gas or the atmosphere in addition to nitrogen. When the thermal bonding is performed in a nitrogen atmosphere, it can be performed under a various condition such as normal pressure, reduced pressure, or increased pressure.

In the heating process of the thermal bonding process, the heating rate is set to not less than 20° C./min. In the conventional active metal bonding method, the heating rate was not more than 5° C./min. By using the brazing material having the DSC curve as described above, it is possible to bond even if the heating rate is increased. Although the upper limit of the heating rate is not particularly limited, it is preferably not more than 100° C./min. When the heating rate is high, i.e., greater than 100° C./min, the bondability may deteriorate. Therefore, the heating rate is preferably not less than 20° C./min and not more than 100° C./min, more preferably not less than 30° C./min and not more than 70° C./min.

The temperature is raised to the bonding temperature by the heating process. The bonding temperature is set to not less than 750° C. Also, the bonding temperature is set to a temperature higher than the peak top temperature of the second endothermic peak. The second endothermic peak is between 810-890° C. By setting the bonding temperature to a temperature higher than the peak top temperature of the second endothermic peak, the melting reaction of the brazing material can be caused properly. Therefore, the bonding temperature is preferably not less than 750° C., more preferably not less than 800° C. The upper limit of the bonding temperature is preferably not more than 1000° C. When the temperature is high, i.e., greater than 1000° C., the temperature is close to the melting point of copper (1085° C.), and the copper plate may be deformed.

The bonding temperature is preferably held for not less than 10 minutes. The time during which the bonding temperature is held is referred to as a heat-holding time. The heat-holding time is preferably not less than 10 minutes and not more than 100 minutes. When the heat-holding time is less than 10 minutes, there is a possibility that the brazing material will not have enough time to melt or solidify. Also, when it is longer than 100 minutes, Sn or In may diffuse too much into the copper plate.

After the heat-holding time has ended, the cooling process is performed. The cooling process is a process of cooling from the bonding temperature to room temperature. The cooling rate is set to not less than 20° C./min. In the conventional active metal bonding method, the cooling rate was about 5° C./min. By using the brazing material having the DSC curve as described above, it is possible to bond even if the cooling rate is increased. Although the upper limit of the cooling rate is not particularly limited, it is preferably not more than 100° C./min. When it is high, i.e., greater than 100° C./min, the bondability may deteriorate. Therefore, the cooling rate is preferably not less than 20° C./min and not more than 100° C./min, more preferably not less than 30° C./min and not more than 70° C./min.

Further, if necessary, the thermal bonding process may be performed while placing a weight on the bonded body 1.

Through the bonding process as described above, the bonded body 1 can be made. By increasing the heating rate in the heating process and the cooling rate in the cooling process, the amount of heat applied to the bonded body 1 can be reduced. As a result, the distribution of the Ti alloy at the bonding boundary between the copper plate 3 and the bonding layer 4 can be controlled. Also, the amount of Ag, Sn, or In diffused into the copper plate can be reduced.

Because the amount of heat applied to the bonded body 1 can be reduced, warp of the bonded body 1 or distortion of the copper plate 3 can be reduced.

The obtained bonded body 1 is etched and processed into the circuit board 20. Multiple components can be obtained as needed. Obtaining multiple components is a method of obtaining small bonded bodies by cutting a large bonded body. There is also a method of subdividing the bonded body or a method of subdividing the ceramic circuit board. Scribing may be performed to easily subdivide. Scribing may be performed to easily subdivide.

EXAMPLES

Examples 1 to 5, Comparative Example 1

Bonding brazing materials shown in Table 1 and Table 2 were prepared. Table 1 shows the grain sizes of the raw material powders. Table 2 shows the composition ratio.

TABLE 1

| | Average grain size $D_{50}$ (μm) | | | | |
|---|---|---|---|---|---|
| | Cu powder | Sn powder | $TiH_2$ powder | C powder | Ag powder |
| Example 1 | 10.5 | 13.2 | 2.0 | — | 2.2 |
| Example 2 | 9.6 | 10.1 | 1.8 | 0.8 | 2.5 |
| Example 3 | 8.6 | 11.4 | 1.7 | 1.6 | 2.5 |
| Example 4 | 10.5 | 13.2 | 2.2 | | 2.7 |
| Example 5 | 10.5 | 13.2 | 2.2 | | 2.7 |
| Comparative example 1 | 8.9 | 12.7 | 3.2 | — | 2.8 |

TABLE 2

| | Composition ratio (mass %) | | | | |
|---|---|---|---|---|---|
| | Cu powder | Sn powder | TiH$_2$ powder | C powder | Ag powder |
| Example 1 | 62.3 | 17 | 10 | 0.7 | 10 |
| Example 2 | 66.8 | 21 | 7 | 0.2 | 5 |
| Example 3 | 57 | 15 | 12 | — | 16 |
| Example 4 | 75.8 | 16 | 5 | 0.2 | 3 |
| Example 5 | 73.8 | 16 | 6 | 0.2 | 4 |
| Comparative example 1 | 31.8 | 10 | 3 | 0.2 | 55 |

Brazing material pastes were made by mixing the bonding brazing material components according to the examples and the comparative example with an organic binder. The DSC curve was measured for each brazing material pastes using the DSC.

As the DSC, TGA-DSC simultaneous thermal analysis apparatus STA449-F3-Jupiter manufactured by NETZSCH was used. The measurement was carried out in an Ar flow by dropping an appropriate amount of the brazing material into an alumina container. The measurement was performed with the lid of the alumina container closed. The temperature program consisted of the heating rate of 20° C./min, 950° C.×20 min holding, and the cooling rate of 20° C./min. 15 mg of the solid content of the sample was used.

The existence or absence of the first endothermic peak or the second endothermic peak in the heating process was checked. At the same time, the peak top temperature was measured. The results are shown in Table 3.

TABLE 3

| | DSC curve (peak top temperature ° C.) Heating process | |
|---|---|---|
| | First endothermic peak | Second endothermic peak |
| Example 1 | 548 | 846 |
| Example 2 | 562 | 852 |
| Example 3 | 559 | 857 |
| Example 4 | 576 | 881 |
| Example 5 | 582 | 883 |
| Comparative example 1 | — | — |

As the table shows, about the bonding brazing materials according to the examples, the first endothermic peak and the second endothermic peak were observed. In contrast, in the comparative example 1, the endothermic peak indicating the decomposition reaction of TiH$_2$ was below 520° C. In other words, no first endothermic peak was observed. In the comparative example 1, the endothermic peak indicating the melting reaction between Cu and the first element was at 722° C. In other words, no second endothermic peak was observed.

Next, a silicon nitride substrate was prepared as the ceramic substrate. The silicon nitride substrate having a thermal conductivity of 90 W/m·K, a three-point bending strength of 600 MPa, and 50 mm long×40 mm wide×0.32 mm thick was used. As the copper plate, the oxygen-free copper plate having 50 mm long×40 mm wide×0.5 mm thick was prepared. The brazing material paste of 30 μm was applied to both surfaces of the ceramic substrate, and the copper plates were respectively placed thereon.

Next, the thermal bonding process was performed. The bonding atmosphere was unified to the nitrogen atmosphere. Also, the bonding conditions were unified to 850° C.×20 minutes. The conditions shown in Table 4 were set for the heating rate and the cooling rate.

TABLE 4

| | Heating rate (° C./min) | Cooling rate (° C./min) |
|---|---|---|
| Example 1 | 20 | 20 |
| Example 2 | 30 | 30 |
| Example 3 | 50 | 50 |
| Example 4 | 60 | 60 |
| Example 5 | 40 | 40 |
| Comparative example 1 | 20 | 20 |

The bonded body was manufactured by the above processes. 10 bonded bodies according to each of the examples and the comparative example were made.

Next, the cross-sectional structures of the obtained bonded bodies were observed. The cross sections of the bonded bodied were observed by SEM-EDX. A surface analysis was performed in the range of 30 μm×the thickness of the bonding layer in the measurement area of the bonding layer is performed. The surface analysis was performed in the range of 30 μm×the thickness of the bonding layer at three arbitrary points. Using the average value of the mass of each element obtained by the surface analysis, the amount of Ag in the bonding layer and the mass ratio $M_{Ag}/M_{Cu}$ were obtained. In addition, the existence or absence of the Ti alloy at the bonding boundary between the copper plate 3 and the bonding layer 4 and the existence ratio of the Ti alloy per 30 μm length were obtained.

Using the point analysis by SEM-EDX, the mass ratio $M_{Ti}/M_{Ag}$ in the Ti alloy and the ratio $M_{Ti}/M_{Sn}$ of the mass $M_{Ti}$ of Ti to the mass $M_{Sn}$ of Sn were obtained. The mass ratio $M_{Ti}/M_{Ag}$ in the central portion of the bonding layer and the mass ratio $M_{Ag}/M_{Cu}$ in the cross section of the bonding layer were measured.

The amount of Cu in the Ti-rich region and the amount of Cu in a portion of the bonding layer between the Ti-rich region and the ceramic substrate were compared. A value obtained by point analysis was used as the amount of Cu in the Ti-rich region. As for the amount of Cu in a portion of the bonding layer, a value obtained by surface analysis of the portion was used.

It was examined whether or not the amount of Cu in a region between the Ti-rich region and the copper plate was not less than 90 wt %. It was also examined whether or not the amount of Cu in a region positioned below the Ti-rich region was not less than 70 wt %. Furthermore, it was also examined whether or not the Ti-rich region contains carbon.

For the region between the Ti-rich region and the copper plate, the point positioned 2 μm from the Ti-rich region on the copper plate side was measured. For the region located below the Ti-rich area, the point located 2 μm from the Ti-rich region toward the ceramic substrate was measured.

The amount of Ag and the amount of Sn in the diffusion region 7 entered 30 μm from the bonding boundary into the copper plate were also measured. The amount of Ag in the Ti-rich region existing at the bonding boundary between the copper plate and the bonding layer was taken as A (wt %), the amount of Ag in the portion entered 30 μm from the bonding boundary to the copper plate was taken as B (wt %), and it was confirmed whether or not A>B was satisfied. Also, when the amount of Sn in the Ti-rich region was taken as D (wt %), and the amount of Sn in the portion 30 μm entered from the bonding boundary to the copper plate was taken as E (% by weight), it was confirmed whether or not D>E was satisfied. The results are shown in Tables 5, 6 and 7.

TABLE 5

Bonding layer (surface analysis)

| | Bonding layer | | Bonding boundary between copper plate and bonding layer | | | | |
|---|---|---|---|---|---|---|---|
| | Ag mass % | Existence or not of ratio Ag/Cu not more than 1/6 | Existence proportion of Ti alloy per 30 μm (%) | Existence or not of Cu amount in Ti-rich region < Cu amount in region of bonding layer on ceramic substrate side of Ti-rich region | Existence or not of region with 90 wt % or more of Cu mass ratio between Ti-rich region and copper plate | Existence or not of region with 70 wt % or more of Cu mass ratio below Ti-rich region | Existence or not of Carbon in Ti-rich region |
| Example 1 | 8.5 | Yes | 95 | Yes | Yes | Yes | Yes |
| Example 2 | 3.8 | Yes | 87 | Yes | Yes | Yes | Yes |
| Example 3 | 14.2 | Yes | 35 | Yes | Yes | Yes | No |
| Example 4 | 1.8 | Yes | 34 | Yes | Yes | Yes | Yes |
| Example 5 | 2.4 | Yes | 56 | Yes | Yes | Yes | Yes |
| Comparative Example 1 | 48 | No | 13 | Yes | Yes | No | No |

TABLE 6

Bonding layer (surface analysis)

| | Bonding boundary between copper plate and bonding layer | | Central portion | |
|---|---|---|---|---|
| | Existence or not of Ti-rich region where mass ratio Ti/Ag is 0.6 or more in Ti alloy | Existence or not of Ti-rich region where mass ratio Ti/Sn is 0.4 or more in Ti alloy | Existence or not of Ti-poor region where mass ratio Ti/Ag is 0.1 or less | Existence or not of Ti-poor region where mass ratio Ag/Cu is 0.1 or less |
| Example 1 | Yes | Yes | Yes | Yes |
| Example 2 | Yes | Yes | Yes | Yes |
| Example 3 | Yes | Yes | Yes | Yes |
| Example 4 | Yes | Yes | Yes | Yes |
| Example 5 | Yes | Yes | Yes | Yes |
| Comparative example 1 | Yes | Yes | Yes | No |

TABLE 7

| | Diffusion region in copper plate | |
|---|---|---|
| | A > B? | D > E? |
| Example 1 | YES | YES |
| Example 2 | YES | YES |
| Example 3 | YES | YES |
| Example 4 | YES | YES |
| Example 5 | YES | YES |
| Comparative example 1 | NO | NO |

As the tables shows, in the bonded bodies according to the examples, the Ti alloy existed at the bonding boundary between the copper plate and the bonding layer. Moreover, not less than 50% and not more than 100% of the Ti alloy was the TiAg alloy having the mass ratio $M_{Ti}/M_{Ag}$ of not less than 0.6. In addition, in the bonded bodies according to the examples, the amount of Ag in the diffusion region 30 μm entered from the bonding boundary to the copper plate was smaller than the amount of Ag in the Ti alloy at the bonding boundary. Similarly, the amount of Sn in the diffusion region of the copper plate was less than the amount of Sn in the Ti alloy at the bonding boundary. It was found that the Ti alloy at the bonding boundary between the copper plate and the bonding layer functions as the barrier layer that suppresses diffusion to the copper plate.

On the other hand, in the comparative example 1, the proportion of the Ti alloy at the boundary between the copper plate and the bonding layer was small. Although the Ag-rich brazing material was used and the Ti-rich region was formed, the proportion of the Ti-rich region existing at the bonding boundary between the copper plate and the bonding layer was small. Also, the Ti-rich region of the comparative example 1 did not contain carbon.

Next, the warp amount of the obtained bonded body and the bonding strength of the copper plate were measured. The warp amount was measured on the long side. When all 10 pieces had a warp amount of not more than 0.3 mm, the pieces were evaluated as best products (⊚). When 1 to 3 pieces had a warp amount exceeding 0.3 mm, the pieces were evaluated as good products (○). When four or more pieces had a warp amount exceeding 0.3 mm, the pieces were evaluated as defective products (x). Further, the peel strength was used as the bonding strength of the copper plate. Specifically, a sample for peel test was prepared in each of the examples and the comparative example. The samples were prepared by bonding a strip-shaped copper plate to the ceramic substrate. At that time, one end of the copper plate was bonded so as to protrude from the ceramic substrate. Peel strength was measured by pulling the protruding copper plate vertically. The results are shown in Table 8.

An example in which the heating rate and the cooling rate of the example 1 are set to 5° C./min was referred to as the reference example 1. An example in which the heating rate and the cooling rate of the comparative example 1 are set to 5° C./min was referred to as the reference example 2.

TABLE 8

| | Amount of warp | Bonding strength (kN/mm) |
|---|---|---|
| Example 1 | ⊚ | 18 |
| Example 2 | ⊚ | 20 |

TABLE 8-continued

|  | Amount of warp | Bonding strength (kN/mm) |
|---|---|---|
| Example 3 | ◎ | 17 |
| Example 4 | ○ | 15 |
| Example 5 | ○ | 14 |
| Comparative example 1 | X | 13 |
| Reference example 1 | ◎ | 7 |
| Reference example 2 | X | 5 |

As the table shows, the bonded bodies according to the examples were excellent in the warp amount and the bonding strength. On the other hand, in the comparative example 1, because the amount of Ag was large, bonding was not successfully performed when the heating rate and cooling rate were high.

Although the warp amount in the reference example 1 was small, the bonding strength was lowered. It was found that the bonding brazing materials of the examples are suitable for the fast-bonding process with the heating rate of not less than 20° C./min. The same applies to the reference example 2 as well. In the nitrogen atmosphere, the bonding brazing material containing a large amount of Ag progressed in nitridation, resulting in a decrease in the bonding strength.

From the above, it was found that, when the brazing material has the DSC curve with the predetermined peak at the heating rate and the cooling rate of 20° C./min, excellent bondability can be obtained even if the heating rate and cooling rate in the bonding process are increased, i.e., not less than 20° C./min. Therefore, it is found that the bonded body according to the embodiment has a small warp amount and is excellent in mass productivity.

While certain embodiments of the invention have been illustrated, these embodiments have been presented by way of example only, and are not intended to limit the scope of the inventions. These novel embodiments may be embodied in a variety of other forms; and various omissions, substitutions, modifications, etc., can be made without departing from the spirit of the inventions. These embodiments and their modifications are within the scope and spirit of the invention and are within the scope of the inventions described in the claims and their equivalents. Also, the embodiments described above can be implemented in combination with each other.

What is claimed is:

1. A bonded body, comprising:
a ceramic substrate;
a copper plate; and
a bonding layer provided on at least one surface of the ceramic substrate and bonding the ceramic substrate and the copper plate,
the bonding layer containing Ag, Cu, Ti, and a first element being one or two selected from Sn and In, wherein a mass ratio of Ag is not more than 20 mass % when surface analysis is performed for a cross section of the bonding layer,
a Ti alloy of Ti and at least one selected from Ag, Cu, Sn, and In existing at a bonding boundary between the copper plate and the bonding layer,
the Ti alloy existing over not less than 30% per a length of 30 μm at the bonding boundary,
wherein at least a portion of the Ti alloy is an alloy containing Ti and the first element, and
a Ti-rich region in which a ratio ($M_{Ti}/M_{E1}$) of a mass $M_{Ti}$ of Ti to a mass $M_{E1}$ of the first element is not less than 0.4 exists in the alloy containing Ti and the first element.

2. The bonded body according to claim 1, wherein
a ratio ($M_{Ag}/M_{Cu}$) of a mass $M_{Ag}$ of Ag to a mass $M_{Cu}$ of Cu is not more than 1/6 when surface analysis is performed for a cross section of the bonding layer.

3. The bonded body according to claim 1, wherein
at least a portion of the Ti alloy is an alloy containing Ti and Ag,
a Ti-rich region in which a ratio ($M_{Ti}/M_{Ag}$) of a mass $M_{Ti}$ of Ti to a mass $M_{Ag}$ of Ag is not less than 0.6 exists in the alloy containing Ti and Ag.

4. The bonded body according to claim 3, wherein
a portion of the bonding layer is located between the Ti-rich region and the ceramic substrate;
an amount of Cu in a central portion of the Ti-rich region is smaller than an amount of Cu in the portion of the bonding layer.

5. The bonded body according to claim 3, wherein
a region having not less than 90 mass % of Cu exists between the Ti-rich region and the copper plate.

6. The bonded body according to claim 3, wherein
the Ti-rich region contains carbon.

7. The bonded body according to claim 3, wherein
a Ti-poor region in which a ratio ($M_{Ti}/M_{Ag}$) of a mass $M_{Ti}$ of Ti to a mass $M_{Ag}$ of Ag is not more than 0.1 exists in a central portion of the bonding layer in a direction connecting the ceramic substrate and the copper plate.

8. The bonded body according to claim 1, wherein
a Ti-poor region in which a ratio ($M_{Ti}/M_{Ag}$) of a mass $M_{Ti}$ of Ti to a mass $M_{Ag}$ of Ag is not more than 0.1 exists in a central portion of the bonding layer in a direction connecting the ceramic substrate and the copper plate.

9. The bonded body according to claim 1, wherein
a thickness of the copper plate is not less than 0.3 mm.

10. The bonded body according to claim 1, wherein
a ratio ($M_{Ag}/M_{Cu}$) of a mass $M_{Ag}$ of Ag to a mass $M_{Cu}$ of Cu is not more than 1/6 when surface analysis is performed for a cross section of the bonding layer,
at least a portion of the Ti alloy is an alloy containing Ti and Ag,
a Ti-rich region in which a ratio ($M_{Ti}/M_{Ag}$) of a mass $M_{Ti}$ of Ti to a mass $M_{Ag}$ of Ag is not less than 0.6 exists in the alloy containing Ti and Ag.

11. The bonded body according to claim 1, wherein
a Ti-poor region in which a ratio ($M_{Ti}/M_{Ag}$) of a mass $M_{Ti}$ of Ti to a mass $M_{Ag}$ of Ag is not more than 0.1 exists in a central portion of the bonding layer in a direction connecting the ceramic substrate and the copper plate,
a ratio ($M_{Ag}/M_{Cu}$) of a mass Mas of Ag to a mass $M_{Cu}$ of Cu is not more than 1/6 when surface analysis is performed for a cross section of the bonding layer.

12. A circuit board comprising the bonded body according to claim 1.

13. A semiconductor device, comprising:
the circuit board according to claim 12, and
a semiconductor element mounted on the circuit board.

14. A manufacturing method for the bonded body according to claim 1, comprising bonding the ceramic substrate and the copper plate using a bonding brazing material,
the bonding brazing material having an endothermic peak between not less than 520° C. and not more than 590°

C. in DSC curve of a heating process when the DSC curve is measured at a heating rate of 20° C./min.

* * * * *